United States Patent
Roessler

(10) Patent No.: US 11,313,896 B1
(45) Date of Patent: Apr. 26, 2022

(54) DIAGNOSIS WITH DOUBLE GATE

(71) Applicant: Infineon Technologies AG, Neubiberg (DE)

(72) Inventor: Werner Roessler, Neufahrn (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 17/148,484

(22) Filed: Jan. 13, 2021

(51) Int. Cl.
| | |
|---|---|
| *H01L 21/66* | (2006.01) |
| *H01L 23/31* | (2006.01) |
| *H01L 23/58* | (2006.01) |
| *H01L 23/66* | (2006.01) |
| *G01R 31/26* | (2020.01) |
| *H01L 23/495* | (2006.01) |
| *H03K 17/687* | (2006.01) |

(52) U.S. Cl.
CPC .... *G01R 31/2621* (2013.01); *H01L 23/49562* (2013.01); *H03K 17/6871* (2013.01)

(58) Field of Classification Search
None
See application file for complete search history.

(56) References Cited

U.S. PATENT DOCUMENTS 10,312,167 B2 * 6/2019 Bayerer ............... H01L 24/48

OTHER PUBLICATIONS

"What is ASIL?" Synopsys, Retrieved from https://www.synopsys.com/automotive/what-is-asil.html, Retrieved on Dec. 4, 2020, 7 pp.

* cited by examiner

*Primary Examiner* — Kenneth B Wells
(74) *Attorney, Agent, or Firm* — Shumaker & Sieffert, P.A.

(57) ABSTRACT

Circuitry to control and monitor solid state power switches. The circuitry may be configured to measure the signal at a control terminal for the power switch to ensure the power switch is in the desired state, e.g., switched ON and conducting current or switched OFF and blocking current. In some examples the circuitry may also be configured to avoid a floating control terminal. The circuit of this disclosure may have at least two connections to the control terminal, e.g., to a gate terminal for a metal oxide semiconductor field effect transistor (MOSFET) or insulated gate bipolar junction transistor (IGBT). In this manner the circuit of this disclosure may ensure the entire signal chain to the control terminal is functioning properly.

19 Claims, 6 Drawing Sheets

DIAGNOSIS WITH DOUBLE GATE

TECHNICAL FIELD

The disclosure relates control of semiconductor switching circuitry.

BACKGROUND

Power switches used in high voltage and/or high current applications, such as electric or hybrid vehicles, may be arranged in parallel to distribute the current to a load among two or more power switches. The power switches may be controlled by a driver circuit connected to a control terminal of each power switch.

SUMMARY

In general, the disclosure describes circuitry to control and monitor solid state power switches. The circuitry may be configured to measure the signal at a control terminal for the power switch to ensure the power switch is in the desired state, e.g., switched ON and conducting current or switched OFF and blocking current. In some examples the circuitry may also be configured to avoid a floating control terminal. The circuit of this disclosure may have at least two connections to the control terminal, e.g., to a gate terminal for a metal oxide semiconductor field effect transistor (MOSFET) or insulated gate bipolar junction transistor (IGBT). In this manner the circuit of this disclosure may ensure the entire signal chain to the control terminal is functioning properly.

In one example, this disclosure describes a device comprising a semi-conductor power switch including a control pad and a source pad. The device further comprises a leadframe with a first terminal and a second terminal both electrically connected to the control pad, and a plurality of source terminals electrically connected to the source pad.

In another example, this disclosure describes a method comprising controlling a semiconductor power switch via a driver signal chain. The semi-conductor power switch includes a control pad, the control pad connects to a first terminal and a second terminal of a leadframe, and the driver signal chain connects to the first terminal of the leadframe. The method also includes verifying operation of the semi-conductor power switch via a diagnostic signal chain, wherein the diagnostic signal chain connects to the second terminal of the leadframe.

In another example, the disclosure describes a system comprising: a device comprising: a semi-conductor power switch including a control pad and a leadframe comprising a first terminal and a second terminal both electrically connected to the control pad. The system also includes a driver signal chain electrically coupled to the first terminal; and a diagnostic signal chain electrically coupled to the second terminal.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure describes circuitry to control and monitor solid state power switches. The circuitry may be configured to measure the signal at a control terminal for the power switches to ensure the power switch is in the desired state, e.g., switched ON and conducting current or switched OFF and blocking current. In some examples, the circuitry may also be configured to avoid a floating control terminal. The circuitry of this disclosure may include hag at least two connections to the control terminal of the power switch, e.g., to a gate terminal for a metal oxide semiconductor field effect transistor (MOSFET) or insulated gate bipolar junction transistor (IGBT). In this manner the circuitry of this disclosure may ensure the entire signal chain to the control terminal is functioning properly.

In contrast to other techniques, a circuit of this disclosure may include a first connection from a power switch driver output to the control terminal of the power switch component. The circuit of this disclosure may also include a second connection from the control terminal of the power switch to a monitor circuit input terminal. The second connection may be separate from the driver output connection, and along a separate conductive pathway.

Figure 1:
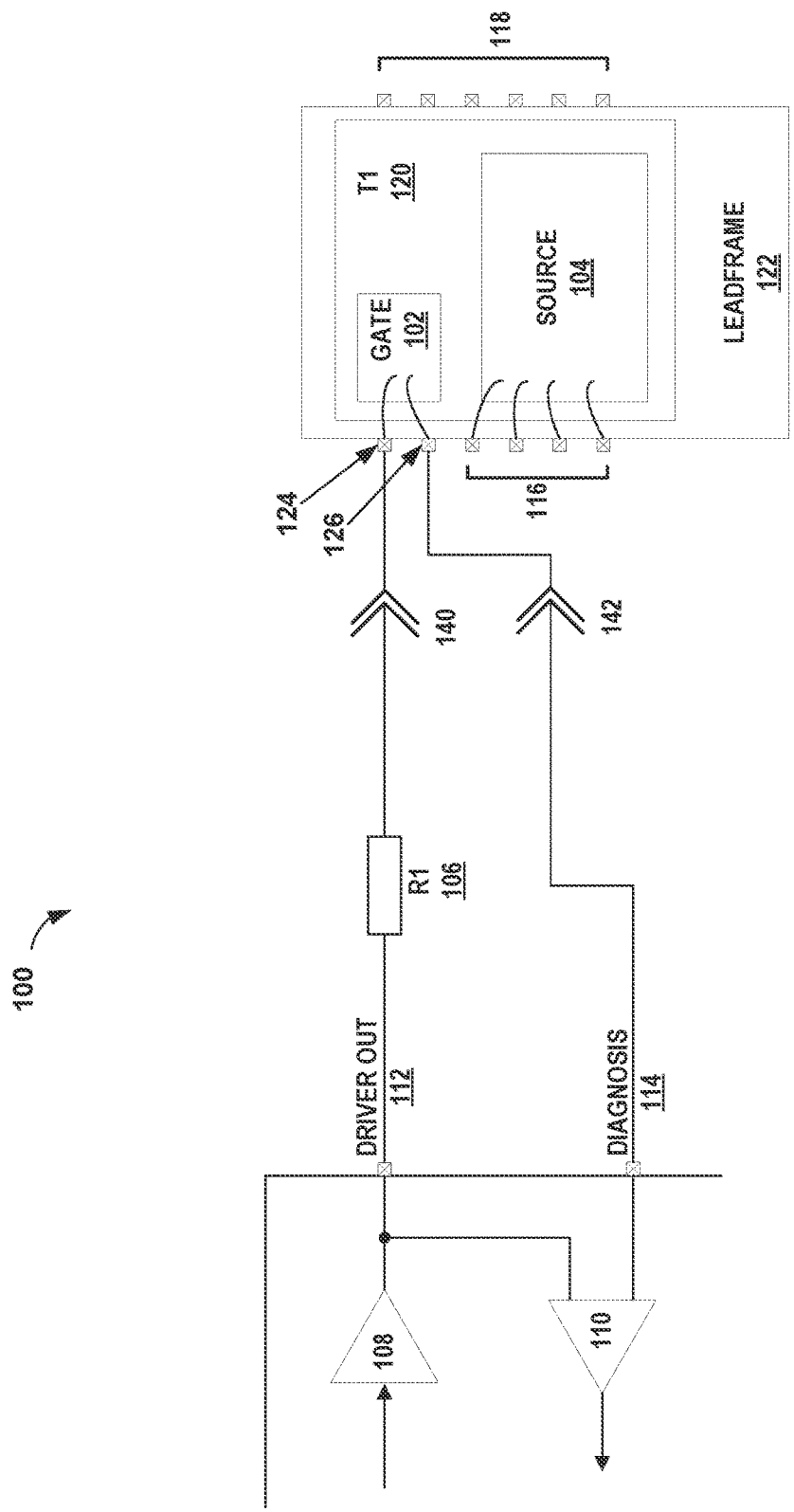
FIG. 1 is a conceptual diagram illustrating a system including double gate terminals according to this disclosure.

FIG. 1 is a conceptual diagram illustrating a system including double gate terminals according to this disclosure. Applications for system 100 may include high voltage and/or high current applications, such as electric or hybrid vehicles. Switch T1 120 may comprise one of two or more power switches arranged in parallel to distribute the current to a load (not shown in FIG. 1) among the switches. The power switches may be controlled by a driver circuit connected to a control terminal of each power switch.

In the example of FIG. 1, system 100 may include switch T1 120, mounted on leadframe 122, driver circuit 108, monitor circuit 110, electrical connectors 140 and 142 and resistor R1 106. In some examples, resistor R1 106 may be a resistor component connected between driver out 112 and gate terminal 124, via connector 140. In other examples, resistor R1 106 may model the inherent resistance in the circuit traces of the driver signal chain between driver out 112 and gate terminal 124. Connectors 140 and 142 may be connections, e.g., male-female connectors, between stacked circuit boards, or types of electrical connectors. The diagnostic signal chain, or monitor signal chain, connects gate terminal 126 to diagnosis terminal 114 via connector 142. In this disclosure, any terminal, e.g., gate terminal 124 and diagnosis terminal 114, may also be referred to as a pin, e.g., as gate pin 124 and diagnosis pin 114. Also, a signal chain, e.g., the driver signal chain may also be referred to as the driver signal path or driver signal pathway in this disclosure.

Switch T1 120 may comprise a semi-conductor power switch including control pad, gate 102, a source pad 104 and a drain pad (not shown in FIG. 1). In the example of FIG. 1, T1 120 is shown as a power MOSFET. However, switch T1 120 may be implemented as any type of electronic switch with a control terminal such as an IGBT, a bipolar junction transistor (BJT), a solid state relay (SSR) and so on. This description will focus on a MOSFET power switch for simplicity, however references to source 104 and the drain of T1 120 may apply equally to the emitter and collector of a BJT or IGBT, or similar terminals of other types of switches.

Leadframe 122 comprises a first gate terminal 124 and a second gate terminal 126 both electrically connected to the control pad, gate 102. Gate 102 may also be referred to as a gate terminal. In the example of FIG. 1, gate 102 has separate wire bonds to each of gate terminals 124 and 126. The diagnosis signal chain reaches all the way to gate 102, rather than to the same gate terminal 124 as the driver signal chain. In this manner the double gate arrangement of system 100 may ensure the entire signal chain to the control terminal, gate 102, is functioning properly.

Leadframe 122 may also include one or more source terminals 116 connected to source pad 104 and one or more drain terminals 118 connected to the drain terminal of T1 120. For a high current device, multiple source terminals 116 and drain terminals 118 may distribute the current load, which may avoid overheating portions of leadframe 122. In some examples, the package, or device comprising leadframe 122 and T1 120 may be implemented as an integrated circuit (IC).

Driver circuit 108 may output a control signal via the driver signal chain to gate 102 which may turn ON or turn OFF switch T1 120. Driver circuit 108 may include switches, amplifiers and other circuitry configured to output the control signal. Driver circuit 108 may receive commands from, for example, processing circuitry (not shown in FIG. 1) that direct driver circuit 108 to output the control signal.

In the example of FIG. 1, monitor circuit 110 is implemented as a comparator that receives the control signal directly from the output of driver circuit 108 at a first comparator input terminal. Monitor circuit 110 also receives the control signal from gate terminal 126 via the diagnosis signal chain and diagnosis pin 114 at a second comparator input terminal. Monitor circuit 110 may output a signal indicating whether the control signal voltage at the first comparator input approximately matches the voltage at the second comparator input. In other examples, monitor circuit 110 may be implemented as an input to an analog to digital converter (ADC), or a similar monitoring circuit.

Figure 2:
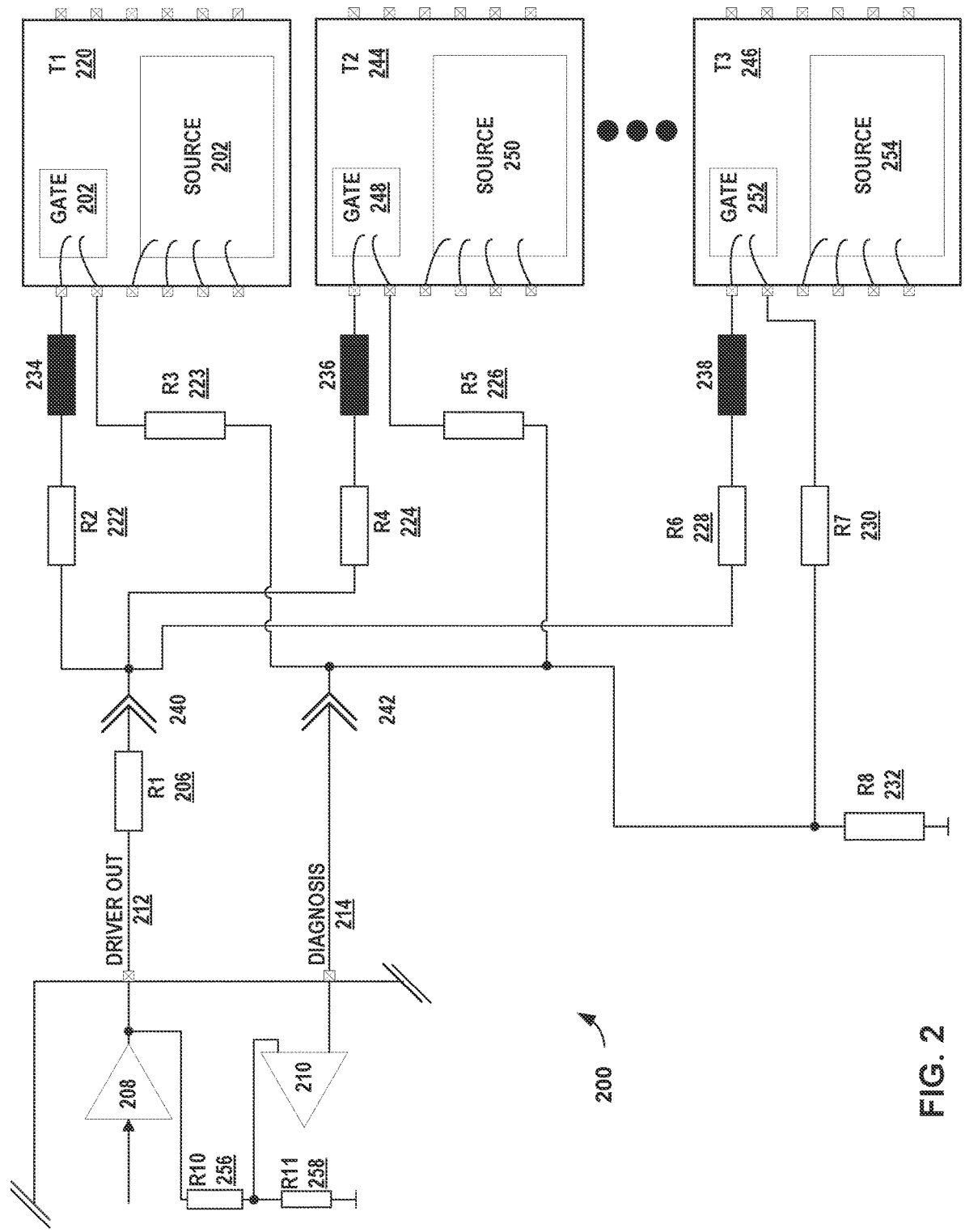
FIG. 2 is a schematic diagram illustrating an example system including double gate terminals and an example resistor network according to this disclosure.

FIG. 2 is a schematic diagram illustrating an example system including double gate terminals and an example resistor network according to this disclosure. System 200 is an example of system 100 described above in relation to FIG. 1 and may have similar functions and characteristics. System 200 shows the driver signal chain connected from driver out 212 controlling multiple power switches arranged in parallel to distribute the current to a load among the two or more power switches T1 220, T2 244 and T3 246. Although FIG. 2 shows three power switches, system 200 may include any number of parallel power switches.

Switches T1 220, T2 244 and T3 246 are examples of switch T1 120 described above in relation to FIG. 1. Each switch may be a semi-conductor power switch including control pad, a source pad, and a drain pad (not shown in FIG. 2) and may be implemented as a MOSFET, IGBT, or other type of switch. Each switch includes double gate terminals on each respective leadframe connected to the control terminal. Each switch includes multiple source terminals on the leadframe electrically connected, e.g., wire bonded in the example of system 200, to each respective source and multiple drain terminals on the lead frame connected to each respective drain pad.

In the example of FIG. 2, the driver signal chain connects the output of driver circuit 208 to driver out 212 and to connector 240 via resistor R1 206, which is the same as resistor R1 206 described above in relation to FIG. 1. For switch T1 220, the driver signal chain connects a first gate terminal through an inductor 234, input resistor R2 222 to connector 240. In some examples, inductors 234, 236 and 238 may be implemented as an inductor electrically connected to the driver signal chain, e.g., by solder, conductive adhesive, etc. In other examples inductors 234, 236 and 238 may be implemented as a ferrite bead mounted near the driver signal chain such that the ferrite bead adds an inductance to the driver signal chain. In other examples, the driver signal chains of system 200 may omit inductors 234, 236 and 238.

In the example of FIG. 2, the monitor chain for switch T1 220 connects a second gate terminal, separate from the first gate terminal, through resistor R2 223, connector 242 to diagnosis terminal 214. The monitor chain also connects to a signal ground through resistor R8 232 at connector 242. Therefore, the monitor chain for switch T1 220 passes through a resistor divider including R3 223 and R8 232 and so the magnitude of voltage at diagnosis terminal 214 may be less than the magnitude of voltage received at gate 202.

In the example of system 200, the monitor circuit comprises a comparator 210 that receives the signal from the monitor chain at a first input of comparator 210. Comparator 210 also receives the output of driver 208 through a resistor divider including resistor R10 256 and R11 258 at a second comparator input. Resistors R10 256 and R11 258 may be arranged to have similar values as R2 223 and R8 232, such that the voltage magnitude at diagnosis terminal 214 approximately equals the voltage magnitude at the second comparator input when system 200 is functioning normally, e.g., with no faults. In this disclosure, "approximately equal" means the same value, within a tolerance range for manufacturing and measurement accuracy. As described above in relation to FIG. 1, the monitoring circuit for system 200 may be implemented, not only as a comparator, but by other types of monitoring circuitry, e.g., an ADC.

For switch T2 244, the driver signal chain connects driver out 212, through common resistor R1 206 to a first gate terminal of the leadframe for T2 244 through connector 240, input resistor R4 224, and inductor 236. The monitor chain for switch T2 244 connects a second gate terminal of the leadframe for T2 244 through resistor R5 226, through connector 242 to diagnosis terminal 214. The monitor chain for switch T2 244 also connects to signal ground through resistor R8 232 at connector 242. As with switch T1 220, the second gate terminal for T2 244 is separate from the first gate terminal.

For switch T3 246, the driver signal chain connects driver out 212, through common resistor R1 206 to a first gate terminal of the leadframe for T3 246 through connector 240, input resistor R6 228, and inductor 238. The monitor chain for switch T3 246 connects a second gate terminal of the leadframe for T3 246 through resistor R7 230, through connector 242 to diagnosis terminal 214. The monitor chain for switch T3 246 also connects to signal ground through pull-down resistor R8 232 at connector 242. As with switch T1 220, the second gate terminal for T3 246 is separate from the first gate terminal.

As described above in relation to FIG. 1, the double gate terminals on the leadframe for each power switch may provide a separate diagnosis signal chain all the way from the control pad to diagnosis terminal 214 that may monitor each element in the driver signal chain, including the bond wire. In the driver signal chain between driver out 212 and the gate pad for the switches, several elements may be responsible for interruption, such as common resistor R1 206, connector 240, and the bond wire from the gate terminal to the control pad. Each individual element could become high-impedance, e.g., soldering points can loosen and circuit traces can get hair cracks, and so on. System 200, with a single driver circuit 208 may provide advantages over multiple driver circuits in reduced complexity, size, and cost. If an element in the driver signal chain becomes high impedance, the ON signal from driver 208 may not reach one or more of power switches T1 220, T2 244 or T3 246. If one of the power switches is OFF when it should be ON, the power switch with the disconnected control pad may no longer carry power and the power to the load may be additionally distributed among the other power switches, e.g., other FETS carrying current. In some examples, the switches carrying the extra power may be significantly higher loaded. A switch carrying excess current may be less efficient, resulting in higher energy losses, and with a tight design of the cooling, in some examples carrying the excess power may lead to overheating and possible failure.

In a similar manner, in the example of a high voltage system, it may be desirable to ensure that when any of power switches T1 220, T2 244 or T3 246 should be switched OFF (driver signal is OFF), then the switches do not conduct power. Pull-down resistor R8 232 may provide advantages for system 200 such as pulling the control terminals, e.g., gate 202, gate 248 and gate 252 to ground when the driver signal from driver 208 is OFF. If an element in the driver signal chain becomes high impedance, the driver signal may not reach the control pad, e.g., gate 202. Resistor R8 232 may ensure that the control pad for each power switch does not float and leave the power switch in an unknown state. For example, for an electric vehicle, a switch with a floating control terminal may pose a hazard to maintenance personnel, or to rescue personnel in the event of a crash, if the switch is in an unknown state and could possibly conduct current. The addition of R8 232 may add a layer of safety to ensure a power switch that is supposed to be OFF is actually OFF.

Figure 3:
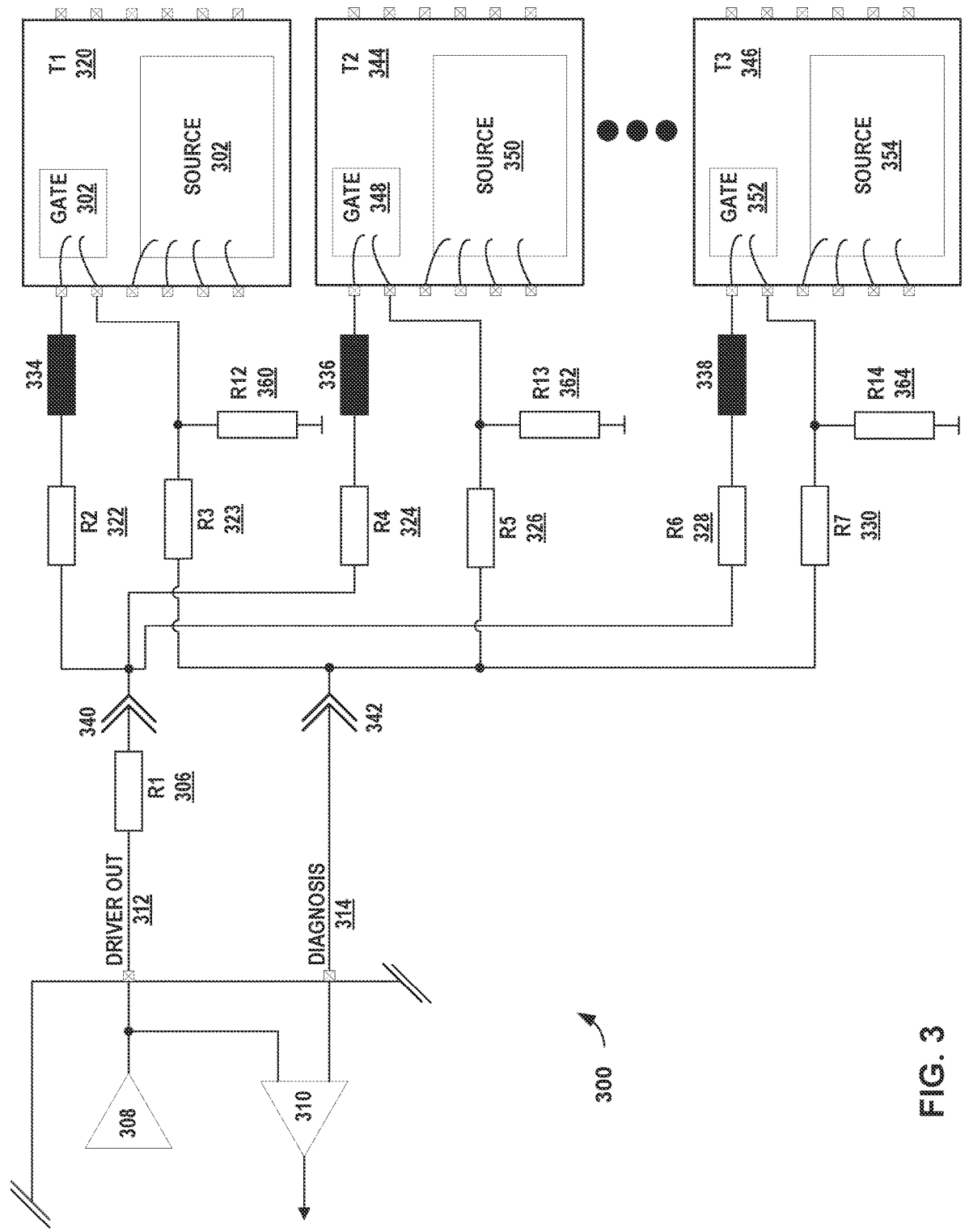
FIG. 3 is a schematic diagram illustrating an example system including double gate terminals configured such that the control signal and the diagnosis signal are at approximately the same voltage, according to this disclosure.

FIG. 3 is a schematic diagram illustrating an example system including double gate terminals configured such that the control signal and the diagnosis signal are at approximately the same voltage, according to this disclosure. System 300 is an example of systems 100 and 200 described above in relation to FIGS. 1 and 2 and may have similar functions and characteristics. Similar to system 200, system 300 shows the driver signal chain from a single driver module connected from driver out 212 controlling multiple power switches. The power switches are arranged in parallel to distribute the current to a load among the two or more power switches T1 320, T2 344 and T3 346. Although FIG. 3 shows three power switches, in other examples, system 300 may include any number of parallel power switches.

Switches T1 320, T2 344 and T3 346 are examples of switch T1 120 described above in relation to FIG. 1 and may have the same characteristics. For example, each switch includes double gate terminals on each respective leadframe connected to the control terminal, such as gate 302. Each switch includes multiple source terminals on the leadframe wire bonded to each respective source and multiple drain terminals on the lead frame connected to each respective drain pad (not shown in FIG. 4).

Similar to systems 100 and 200, the driver signal chain connects the output of driver circuit 308 to driver out 312 and to connector 340 via common resistor R1 306, which is the same as resistor R1 106 described above in relation to FIG. 1. For switch T1 320, the driver signal chain connects a first gate terminal through an inductor 334 and resistor R2 322 to connector 340. As with system 200, inductors 334, 336 and 338 may be implemented as an inductor component or as a ferrite bead mounted near the driver signal chain. In other examples, the driver signal chains of system 300 may omit the inductors.

The monitor chain (also referred to as "the diagnostic signal chain") for switch T1 320 connects a second gate terminal, separate from the first gate terminal, through resistor R3 323 and connector 342 to diagnosis terminal 314. In contrast to system 200, the monitor chain for T1 320 connects to a signal ground through resistor R12 360 at the second gate connector. Each power switch includes a separate pull-down resistor connected to ground at the second gate connector. The monitor chain for switch T1 320 passes through resistor R3 323 and connector 342 to diagnosis terminal 314.

In the arrangement of circuit 300, the voltage at diagnosis terminal 314 may be approximately the same as the voltage output from driver 308, which may simplify the monitor circuit, when compared to system 200. In the example of system 300, the monitor circuit is comparator 310 that receives the signal from the monitor chain at a first input of comparator 310. Comparator 310 also receives the output of driver 308 at a second comparator input, such that the voltage magnitude at diagnosis terminal 314 approximately equals the voltage magnitude at the second comparator input from driver 308 when system 300 is functioning normally, e.g., with no faults.

For switch T2 344, the driver signal chain connects driver out 312, through common resistor R1 306 to a first gate terminal of the leadframe for T2 344 through connector 340, resistor R4 324, and inductor 336. The monitor chain for switch T2 344 connects a second gate terminal of the leadframe for T2 344 through resistor R5 326, through connector 342 to diagnosis terminal 314. The monitor chain for switch T2 344 also connects to signal ground through resistor R13 362 connected to the second gate terminal. As with switch T1 320, the second gate terminal for T2 344 is separate from the first gate terminal.

For switch T3 346, the driver signal chain connects driver out 312, through common resistor R1 306 to a first gate terminal of the leadframe for T3 346 through connector 340, resistor R6 328, and inductor 338. The monitor chain for switch T3 346 connects a second gate terminal of the leadframe for T3 346 through resistor R7 330 and connector 342 to diagnosis terminal 314. The monitor chain for switch T3 346 also connects to signal ground through resistor R14 364 at the second gate terminal. As with switch T1 320, the second gate terminal for T3 346 is separate from the first gate terminal.

As described above in relation to FIGS. 1 and 2, the double gate terminals on the leadframe for each power switch may provide a separate diagnosis signal chain all the way from the control pad to diagnosis terminal 2H 314 that may monitor each element in the driver signal chain, including the bond wire. Also, similar resistor R8 232 described above in relation to FIG. 2, resistors R12 360, R13 362 and R14 364 may provide an extra layer of safety to ensure redundant secure discharge of voltage on the control pad when the power switches of system 300 are turned OFF. By preventing a floating control pad resistors R12 360, R13 362 and R14 364 may help ensure the power switch is not left in an unknown state in the event of a high impedance issue in the driver signal chain.

Figure 4:
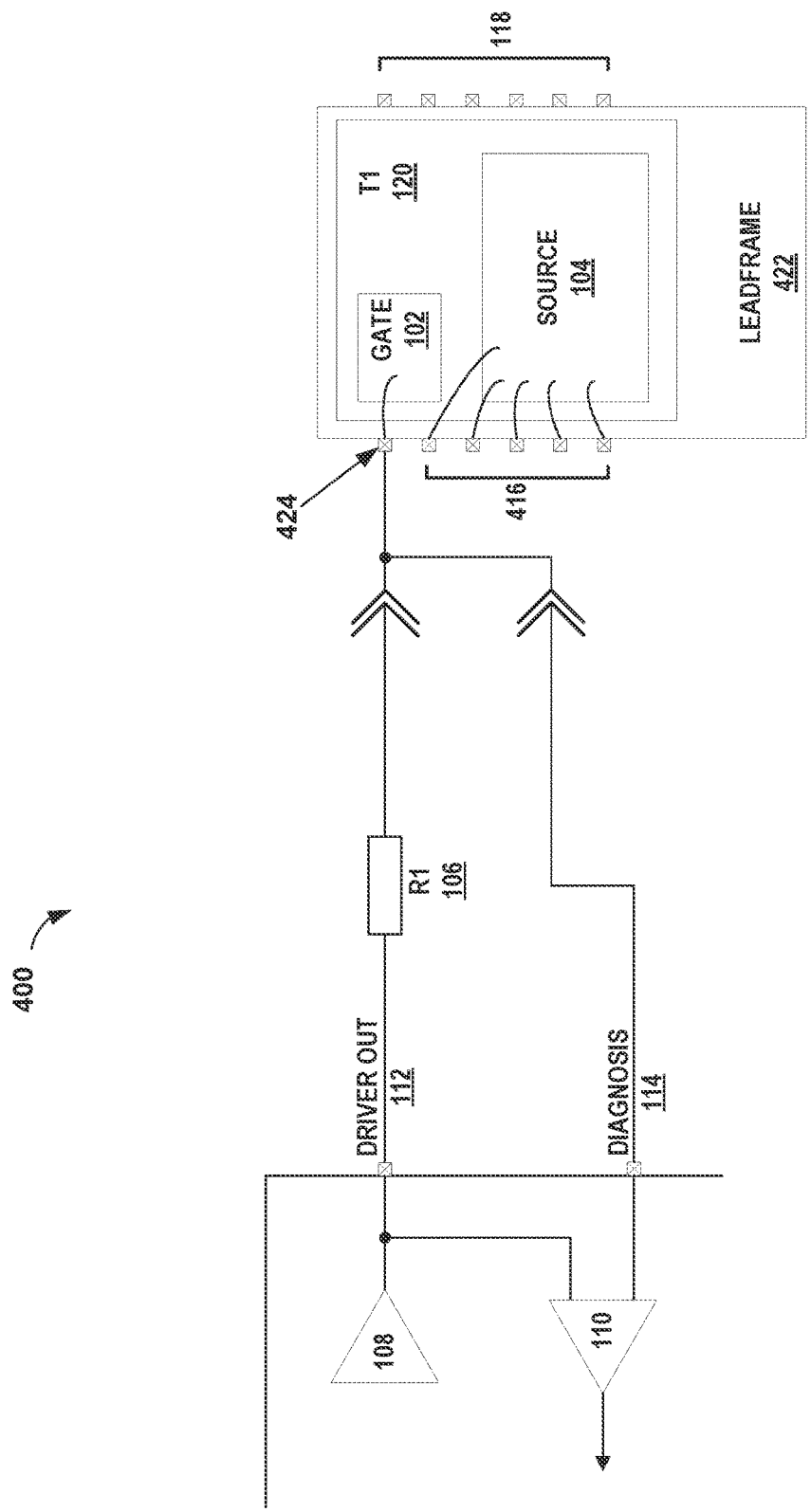
FIG. 4 is a conceptual diagram illustrating an example system for controlling a power switch.

FIG. 4 is a conceptual diagram illustrating an example system for controlling a power switch. In the example of FIG. 4, system 400 is similar to system 100 described above in relation to FIG. 1, except that leadframe 422 in system 400 has only one gate terminal 424, not a double gate, and source terminals 416. In FIG. 4, elements with the same reference numbers described above in relation to FIG. 1 have the same functions and characteristics.

The examples of systems 100, 200, and 300 and may have advantages when compared to system 400. For example, the diagnostic signal chain for systems 100, 200, 300 may monitor the elements in the driver signal chain from the output of driver circuit 108 to the control pad, gate 102, including the electrical connection between the gate terminal of the leadframe and the control pad. In the example of FIGS. 1-4, the electrical connection between the gate terminal of the leadframe and the control pad is shown as a wire bond. In other examples, the electrical connection may be implemented using other techniques, such as conductive adhesive, a jumper clip, solder connections and so on.

Figure 5:
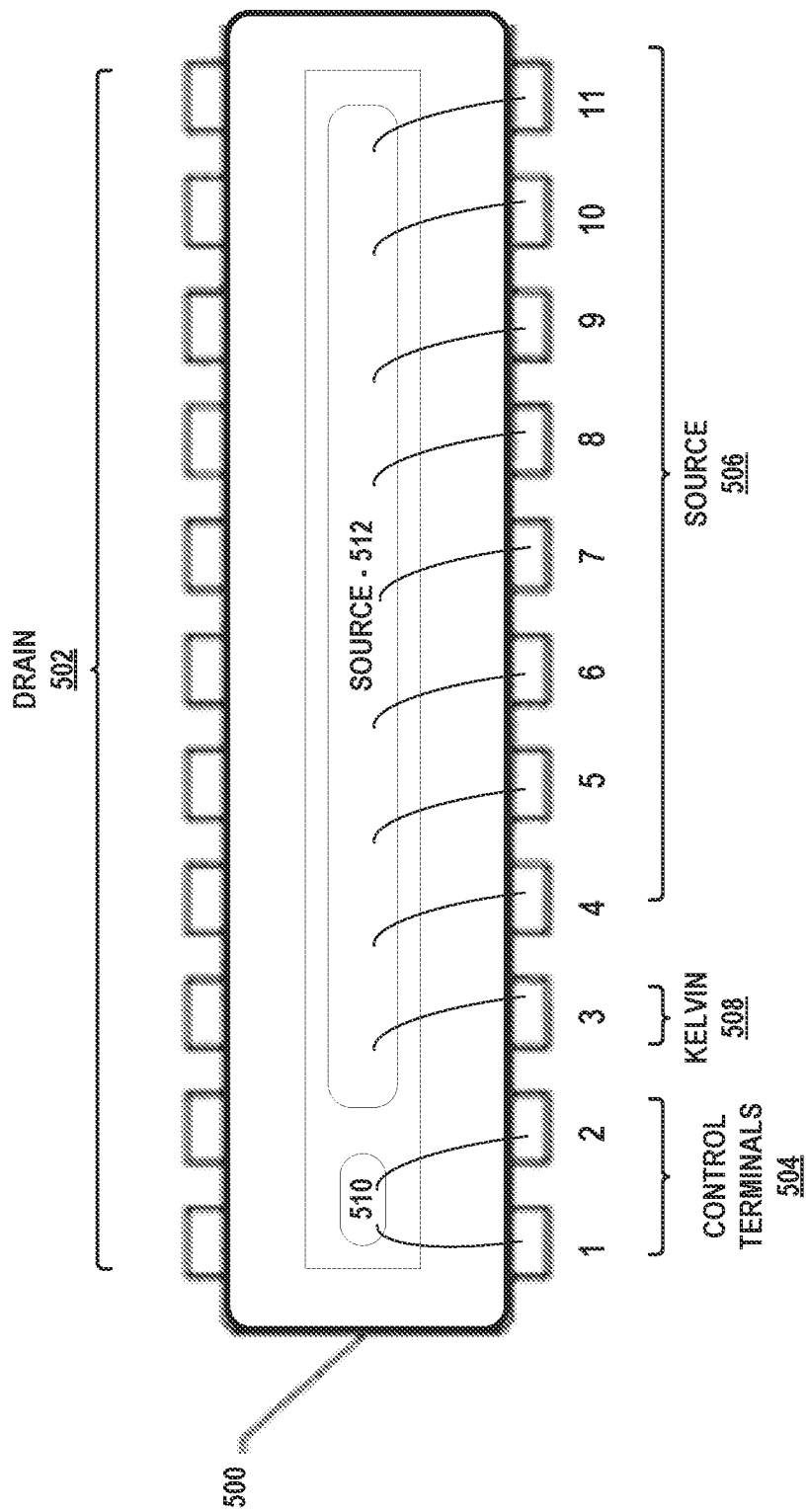
FIG. 5 is a conceptual diagram illustrating an example power switch device including double gate terminals according to this disclosure.

FIG. 5 is a conceptual diagram illustrating an example power switch device including double gate terminals according to this disclosure. Device 500 is an example of leadframe 122 and transistor T1 120, described above in relation to FIG. 1 and may have the same or similar functions and characteristics.

Device 500 may include a lead frame with control terminals 504 (pins 1 and 2), kelvin terminal 508 (pin 3), source terminals 506 (pins 4-11) and drain terminals 502. Device 500 may also include a control pad, gate 510, electrically connected to a first terminal (pin 1) and a second terminal (pin 2) of control terminals 504. Source pad 512 may connect to kelvin terminal 508 as well as source terminals 506.

In some examples, device 500, with double gate control terminals 504 may be cost neutral when compared to other examples of a power switch device with a single gate terminal and may have similar performance. For example, the on resistance (RDS-ON) for a high power switch, e.g., a power MOSFET, IGBT, and so on, may be relatively higher than the RDS-ON for a low power switch. Therefore, the RDS-ON for a power switch may be significantly higher than the impedance of a bond wire, such that converting a source terminal of the lead frame from a source terminal to a second gate terminal separate from the first gate terminal may have negligible impact on the overall RDS-ON of device 500.

Figure 6:
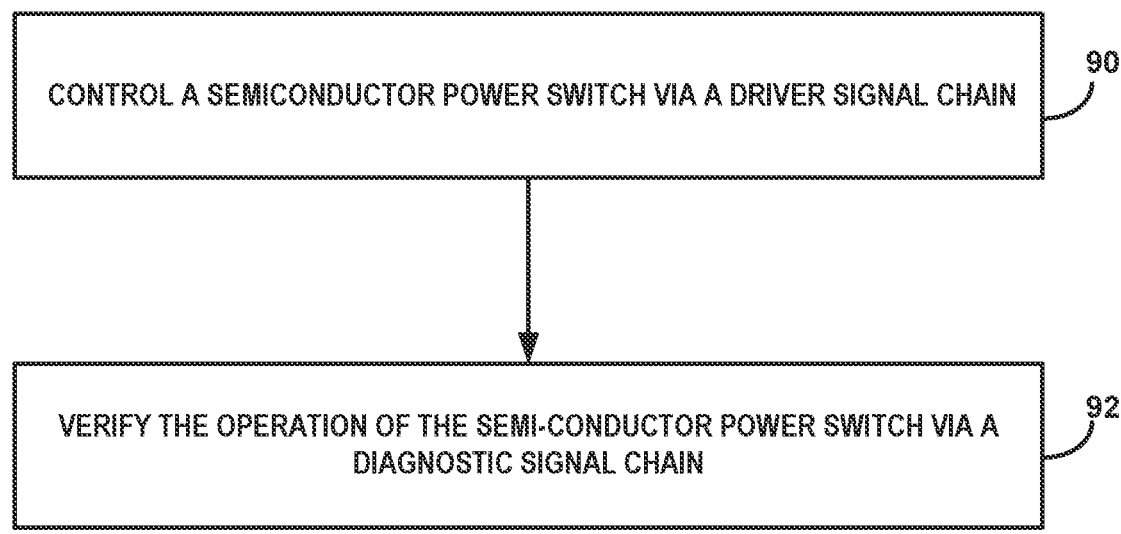
FIG. 6 is a flow chart illustrating an example operation of the system according to this disclosure.

FIG. 6 is a flow chart illustrating an example operation of the system according to this disclosure. FIG. 6 will be described from the perspective of the systems 100, 200 and 300 shown in FIGS. 1-3, although other devices could perform the steps shown in FIG. 6.

Driver 108 may output a control signal via a driver signal pathway to control a semiconductor power switch, e.g., T1 120 (90). As described above in relation to FIGS. 2 and 3, a driver, such as driver 108, may control two or more power switches in parallel to spread the current to a load across the two or more power switches. Spreading the power to the load may be desirable to manage heat generated by the current through the power switches and associated circuitry.

Switch T1 120 includes a control pad, gate 102 that connects to both a first terminal 124 and a separate second terminal 126 of leadframe 122. The driver signal chain, via resistor R1 106 and connector 140 connects to terminal 124. As described above in relation to FIG. 2, should an element in the driver signal chain becomes high impedance, the signal from driver 108 may not reach gate 102. For example, connector 140 may comprise a solder, or similar connection on a male portion of connector 140 as well as a solder connection on a female portion of connector 140. Either connection may become high impedance, such as from vibration, manufacturing issues, expansion and contraction caused temperature cycles and so on. Similarly, the electrical connection between either of gate terminals 124 to gate 102 may become high impedance, for similar reasons. A wire bond, as shown in FIG. 1, may become high impedance at any of the connection to gate terminal 124, at the electrical connection at gate 102 or a break in the wire. Other types of connections between leadframe 122 and gate 102 (not shown in FIG. 1) such as silver epoxy, solder, or other types of bond may also become high impedance.

The double gate arrangement of this disclosure means that monitor circuit 110 may verify the operation of switch T1 120 via a diagnostic signal chain connected between terminal 126 and diagnosis terminal 114 (92). The circuit of this disclosure may verify the entire signal chain including the bond between gate terminals 124 and 126 to gate 102, which may improve safety, for example in detecting that switch T1 120 is OFF when the driver signal commands switch T1 120 to be OFF. As described above in relation to FIG. 2, if switch T1 120 is in an unknown state, then switch T1 120 may conduct when T1 120 should be OFF, which may pose a hazard to maintenance personnel. In some examples, as described above in relation to FIGS. 2 and 3, the circuit of this disclosure may include one or more pull-down resistors to ensure the control terminals for the switches are in a known state to turn OFF the switches when the driver signal is not outputting a turn ON signal.

In addition, for systems with parallel power switches, such as systems with a second semi-conductor power switch including a control pad connected to a third terminal and a fourth terminal of a second leadframe, as shown in FIGS. 2 and 3, the drive signal chain may be electrically coupled to the third terminal and the diagnostic signal chain electrically coupled to the fourth terminal. In this manner, the diagnostic signal chain of this disclosure may insure that current to a load is distributed among the several parallel power switches by outputting a signal to indicate when one or more switches may not be ON when the switches should be ON.

This disclosure may also be described in the following examples:

Example 1: A device includes a semi-conductor power switch including a control pad and a source pad; and a leadframe includes a first terminal and a second terminal both electrically connected to the control pad; and a plurality of source terminals electrically connected to the source pad.

Example 2: The device of example 1, wherein: the first terminal is configured to receive a control driver signal, and the second terminal is configured to connect to a diagnostic signal chain.

Example 3: The device of any combination of examples 1 and 2, wherein the semi-conductor power switch comprises a metal oxide semiconductor field effect transistor (MOSFET), and wherein the control pad of the semi-conductor power switch is a gate pad.

Example 4: The device of any combination of examples 1 through 3, wherein the second terminal is configured to connect to a signal ground through a resistor.

Example 5: A system includes a device includes a semi-conductor power switch including a control pad; and a leadframe comprising a first terminal and a second terminal both electrically connected to the control pad; a driver signal chain electrically coupled to the first terminal; and a diagnostic signal chain electrically coupled to the second terminal.

Example 6: The system of example 5, wherein the device is a first device, the system further comprising a second device including: a second semi-conductor power switch including a control pad; and a second leadframe comprising a third terminal and a fourth terminal both electrically connected to the control pad of the second semi-conductor power switch, wherein the driver signal chain is electrically coupled to the third terminal and the diagnostic signal chain is electrically coupled to the fourth terminal.

Example 7: The system of examples 5 and 6, wherein the driver signal chain further comprises: a driver output terminal, and a common resistor located in the driver signal chain connecting the driver output terminal to the first terminal and the second terminal.

Example 8: The system of any combination of examples 5 through 7, wherein the driver signal chain further comprises: a first input resistor that connects the common resistor to the first terminal, and a second input resistor that connects the common resistor to the third terminal.

Example 9: The system of any combination of examples 5 through 8, wherein the diagnostic signal chain comprises: a diagnosis input terminal; a first output resistor that connects the second terminal to the diagnosis input terminal; a second output resistor that connects the fourth terminal to the diagnosis input terminal.

Example 10: The system of any combination of examples 5 through 9, wherein the diagnostic signal chain further comprises a pull-down resistor that connects the diagnosis input terminal to a signal ground.

Example 11: The system of any combination of examples 5 through 10, wherein the diagnostic signal chain further comprises: a first pull down resistor that connects the second terminal to a signal ground; and a second pull-down resistor that connects the fourth terminal to the signal ground.

Example 12: The system of any combination of examples 5 through 11, wherein the diagnosis input terminal connects to a comparator.

Example 13: The system of any combination of examples 5 through 12, wherein the diagnosis input terminal connects to an analog to digital converter (ADC).

Example 14: The system of any combination of examples 5 through 13, wherein the semi-conductor power switch comprises a metal oxide semiconductor field effect transistor (MOSFET) comprising a source pad, and the leadframe comprises a plurality of source terminal electrically connected to the source pad.

Example 15: A method includes controlling a semiconductor power switch via a driver signal chain, wherein: the semi-conductor power switch includes a control pad, the control pad connects to a first terminal and a second terminal of a leadframe, and the driver signal chain connects to the first terminal of the leadframe; and verifying operation of the semi-conductor power switch via a diagnostic signal chain, wherein the diagnostic signal chain connects to the second terminal of the leadframe.

Example 16: The method of example 15, wherein: the semi-conductor power switch is a first semi-conductor power switch, and the leadframe is a first lead frame, the system further comprising a second semi-conductor power switch wherein: the second semi-conductor power switch includes a control pad, and the control pad connects a third terminal and a fourth terminal of a second leadframe, wherein the drive signal chain is electrically coupled to the third terminal and the diagnostic signal chain is electrically coupled to the fourth terminal.

Example 17: The method of examples 15 and 16, wherein the driver signal chain further comprises: a driver output terminal, and a common resistor located in the driver signal chain connecting the driver output terminal to the first terminal and the second terminal.

Example 18: The method of any combination of examples 15 through 17, wherein the driver signal chain further comprises: a first input resistor that connects the common resistor to the first terminal, and a second input resistor that connects the common resistor to the third terminal.

Example 19: The method of any combination of examples 15 through 18, wherein the diagnostic signal chain comprises: a diagnosis input terminal; a first output resistor that connects the second terminal to the diagnosis input terminal; and a second output resistor that connects the fourth terminal to the diagnosis input terminal.

Example 20: The method of any combination of examples 15 through 19, wherein the diagnosis input terminal connects to a comparator.

Various examples of the disclosure have been described. These and other examples are within the scope of the following claims.

What is claimed is:

1. A device comprising:
    a semi-conductor power switch including a control pad and a source pad; and
    a leadframe comprising:
        a first terminal and a second terminal both electrically connected to the control pad, wherein the second terminal is configured to connect to a signal ground through a resistor; and
        a plurality of source terminals electrically connected to the source pad.

2. The device of claim 1, wherein:
    the first terminal is configured to receive a control driver signal, and
    the second terminal is configured to connect to a diagnostic signal chain.

3. The device of claim 1,
    wherein the semi-conductor power switch comprises a metal oxide semiconductor field effect transistor (MOSFET), and
    wherein the control pad of the semi-conductor power switch is a gate pad.

4. A system comprising:
    a device comprising:
        a semi-conductor power switch including a control pad; and
        a leadframe comprising a first terminal and a second terminal both electrically connected to the control pad, wherein the second terminal is configured to connect to a signal ground through a resistor;
    a driver signal chain electrically coupled to the first terminal; and
    a diagnostic signal chain electrically coupled to the second terminal.

5. The system of claim 4,
    wherein the device is a first device, the system further comprising a second device including:

a second semi-conductor power switch including a control pad; and a second leadframe comprising a third terminal and a fourth terminal both electrically connected to the control pad of the second semi-conductor power switch, wherein the driver signal chain is electrically coupled to the third terminal and the diagnostic signal chain is electrically coupled to the fourth terminal.

6. The system of claim 5, wherein the driver signal chain further comprises:

a driver output terminal, and a common resistor located in the driver signal chain connecting the driver output terminal to the first terminal and the second terminal.

7. The system of claim 6, wherein the driver signal chain further comprises:

a first input resistor that connects the common resistor to the first terminal, and a second input resistor that connects the common resistor to the third terminal.

8. The system of claim 5, wherein the diagnostic signal chain comprises:

a diagnosis input terminal;

a first output resistor that connects the second terminal to the diagnosis input terminal;

a second output resistor that connects the fourth terminal to the diagnosis input terminal.

9. The system of claim 8, wherein the diagnostic signal chain further comprises a pull-down resistor that connects the diagnosis input terminal to a signal ground.

10. The system of claim 8, wherein the diagnostic signal chain further comprises:

a first pull down resistor that connects the second terminal to a signal ground; and a second pull-down resistor that connects the fourth terminal to the signal ground.

11. The system of claim 8, wherein the diagnosis input terminal connects to a comparator.

12. The system of claim 8, wherein the diagnosis input terminal connects to an analog to digital converter (ADC).

13. The system of claim 4, wherein the semi-conductor power switch comprises a metal oxide semiconductor field effect transistor (MOSFET) comprising a source pad, and the leadframe comprises a plurality of source terminals electrically connected to the source pad.

14. A method comprising:

controlling a semi-conductor power switch via a driver signal chain, wherein:

the semi-conductor power switch includes a control pad, the control pad connects to a first terminal and a second terminal of a leadframe, the second terminal is configured to connect to a signal ground through a resistor, and the driver signal chain connects to the first terminal of the leadframe; and verifying operation of the semi-conductor power switch via a diagnostic signal chain, wherein the diagnostic signal chain connects to the second terminal of the leadframe.

15. The method of claim 14, wherein:

the semi-conductor power switch is a first semi-conductor power switch, and the leadframe is a first lead frame, the system further comprising a second semi-conductor power switch wherein:

the second semi-conductor power switch includes a control pad, and the control pad connects to a third terminal and a fourth terminal of a second leadframe, wherein the driver signal chain is electrically coupled to the third terminal and the diagnostic signal chain is electrically coupled to the fourth terminal.

16. The method of claim 15, wherein the driver signal chain further comprises:

a driver output terminal, and a common resistor located in the driver signal chain connecting the driver output terminal to the first terminal and the second terminal.

17. The method of claim 16, wherein the driver signal chain further comprises:

a first input resistor that connects the common resistor to the first terminal, and a second input resistor that connects the common resistor to the third terminal.

18. The method of claim 15, wherein the diagnostic signal chain comprises:

a diagnosis input terminal;

a first output resistor that connects the second terminal to the diagnosis input terminal; and a second output resistor that connects the fourth terminal to the diagnosis input terminal.

19. The method of claim 14, wherein the diagnosis input terminal connects to a comparator.

\* \* \* \* \*